United States Patent
Winter et al.

(10) Patent No.: US 7,901,656 B2
(45) Date of Patent: Mar. 8, 2011

(54) METAL OXIDE-CONTAINING NANOPARTICLES

(75) Inventors: Charles H. Winter, Bloomfield Hills, MI (US); Charles L. Dezelah, IV, Bay City, MI (US)

(73) Assignee: Wayne State University, Detroit, MI (US)

( * ) Notice: Subject to any disclaimer, the term of this patent is extended or adjusted under 35 U.S.C. 154(b) by 857 days.

(21) Appl. No.: 10/549,950

(22) PCT Filed: Mar. 19, 2004

(86) PCT No.: PCT/US2004/008369
§ 371 (c)(1),
(2), (4) Date: Sep. 20, 2005

(87) PCT Pub. No.: WO2004/085305
PCT Pub. Date: Oct. 7, 2004

(65) Prior Publication Data
US 2006/0084278 A1    Apr. 20, 2006

Related U.S. Application Data

(60) Provisional application No. 60/456,528, filed on Mar. 21, 2003.

(51) Int. Cl.
*C01B 13/14* (2006.01)
*C01G 5/00* (2006.01)
*C01G 3/02* (2006.01)
*C01G 7/00* (2006.01)

(52) U.S. Cl. ............. 423/592.1; 423/604; 977/762; 977/773; 977/775; 977/776

(58) Field of Classification Search ............ 423/592.1, 423/604–643, 594.17–594.19; 977/773–777, 977/810–811, 762; 502/300–355
See application file for complete search history.

(56) References Cited

U.S. PATENT DOCUMENTS

| 5,262,357 | A | 11/1993 | Alivisatos et al. |
| 5,491,114 | A | 2/1996 | Goldstein |
| 5,559,057 | A | 9/1996 | Goldstein |
| 5,576,248 | A | 11/1996 | Goldstein |
| 5,670,279 | A | 9/1997 | Goldstein |

(Continued)

OTHER PUBLICATIONS

Aslam et al., "Formation of Cu and Cu2O Nanoparticles by Variation of the Surface Ligand: Preparation, Structure, and Insulation-to-Metallic Transition," Journal of Colloid and Interface Science 255, 79-90 (2002); published online Nov. 22, 2002.*

(Continued)

*Primary Examiner* — Stanley Silverman
*Assistant Examiner* — Anthony J Zimmer
(74) *Attorney, Agent, or Firm* — Brooks Kushman P.C.

(57) ABSTRACT

The present invention provides a copper oxide-containing composition that includes copper oxide nanoparticles and one or more heteroatom donor ligands bonded to the surface of the nanoparticles, where x and y are numbers having a ratio that is equal to the ratio of the average number of M atoms to the average number of O atoms in the nanoparticles. The nanoparticles are stabilized by the one or more heteroatom donor ligands which act as a protective layer that cap the surface of the nanoparticles. The present invention also provides a solution of the copper oxide nanoparticles that may be applied to a substrate and then subsequently reduced to copper metal. Finally, the invention provides a method of preparing the copper oxide nanoparticles.

11 Claims, 5 Drawing Sheets

DTA/TGA of Cu$_2$O nanoparticles

U.S. PATENT DOCUMENTS

| | | | |
|---|---|---|---|
| 5,755,987 | A | 5/1998 | Goldstein et al. |
| 5,850,064 | A | 12/1998 | Goldstein |
| 5,897,945 | A * | 4/1999 | Lieber et al. .................. 428/323 |
| 5,922,403 | A * | 7/1999 | Tecle ............................ 427/212 |
| 6,060,026 | A | 5/2000 | Goldstein |
| 6,203,768 | B1 | 3/2001 | McCormick et al. |
| 6,268,041 | B1 | 7/2001 | Goldstein |
| 6,277,740 | B1 | 8/2001 | Goldstein |
| 6,361,660 | B1 | 3/2002 | Goldstein |
| 6,455,746 | B1 | 9/2002 | Dubois et al. |
| 6,645,444 | B2 * | 11/2003 | Goldstein ......................... 423/1 |
| 6,860,924 | B2 * | 3/2005 | Rajagopalan et al. .......... 96/154 |
| 6,887,151 | B2 | 5/2005 | Leen et al. |
| 6,887,297 | B2 | 5/2005 | Winter et al. |
| 7,022,910 | B2 | 4/2006 | Gaudina et al. |
| 2002/0006723 | A1 | 1/2002 | Goldstein |
| 2002/0098680 | A1 | 7/2002 | Goldstein |
| 2003/0003300 | A1 | 1/2003 | Korgel et al. |
| 2003/0008145 | A1 | 1/2003 | Goldstein |
| 2003/0115988 | A1 | 6/2003 | Poznarsky et al. |
| 2003/0192585 | A1 | 10/2003 | Beckenbaugh et al. |
| 2003/0230337 | A1 | 12/2003 | Gaudiana et al. |

OTHER PUBLICATIONS

Borgohain et al., "Quantum size effects in CuO nanoparticles," Physical Review B 61, 16, 11093-11096, Apr. 15, 2000.*

Ziegler et al, "Synthesis of Organic Monolayer-Stabilized Copper Nanocrystals in Supercritical Water," Journal of the American Chemical Society 2001, 123, 7797-7803.*

Dong et al. "Preparation of Cuprous Oxide Particles of Different Crystallinity," Journal of Colloid and Interface Science 241, 85-89 (2001).*

Wang et al. "Preparation of nanocrystalline metal oxide powders with the surfactant mediated method," Inorganic Chemistry Communications 5, (2002) 751-755.*

Fan et al. "Preparation of Cu-Al2O3 nano-composite powders by electroless copper plating," Cailiao Kexue Yu Gongyi (2002), 10(4), 357-361.*

"Surface and Size Effect on the Lattice Parameter in Small Particles of Gold and Platinum", C. Solliard & M. Flueli, Surface Science, 156, 1985, pp. 487-494.

"Dependence of Lattice Parameters", J. Woltersdorf et al., Surface Science, pp. 65-69.

"Hyperfine Interactions in Stripped Atoms Isoelectronic with Alkali Atoms", S.N. Ray, James E. Rodgers & T.P. Das, The American Physical Society, vol. 13, No. 6, Jun. 1976.

"The Melting of Small Particles of Lead and Indium", C.J. Coombes, Journal of Physics F—Metal Physics, vol. 2, 1972, pp. 440-448.

"Melting Behvior of Nanocrystalline Aluminum Powders", J. Eckert, J.C. Holzer, C.C. Ahn, Z. Fu and W.L. Johnson, Nanostructured Materials, vol. 2, 1983, pp. 407-413.

"The Size Dependence of the Melting Point of Small Particles of Tin", C.R.M. Wronski, British Journal of Applied Physics, vol. 18, Jan. to Dec. 1967, pp. 1731-1737.

"The Instability of Polycrystalline Thin Films: Experiment and Theory", K.T. Miller & F.F. Lange, Journal of Materials Research, vol. 5, No. 1, Jan. 1990, pp. 151-160.

"Condensation of Ordered nanocrystal Thin Films", Brian A. Korgel & Donald Fitzmaurice, Physical Review Letters, vol. 80, No. 16, Apr. 20, 1998, pp. 3531-3534.

"The Cracking and Decohesion of Thin Films", A.G. Evans, M.D. Drory & M.S. Hu, Journal of Materials Research, vol. 3, No. 5, Sep./Oct. 1988, pp. 1043-1049.

"Spin-On Cu Films for Ultralarge Scale Integrated Metallization", Hirohiko Murakami et al., Journal of Vacuum Science & Technology B, 17(5), Sep./Oct. 1999, pp. 2321-2324.

"Chemical Vapor Deposition of Copper for Multilevel Metallization", Alain E. Kaloyeros & Michael A. Fury, Material Research Socity Bulletin, vol. XVIII, No. 6, Jun. 1993, pp. 22-28.

"Estimation of the Variation of the melting Temperature with the Size of Small Particles, on the Basis of a Surface-Phonon instability Model", M. Wautelet, Journal of Physics D, Applied Physics, vol. 24, No. 3, Mar. 14, 1991, pp. 343-346.

International Search Report dated Nov. 18, 2004 in corresponding PCT/US04/08369, filed Mar. 19, 2004, 1 pg.

* cited by examiner

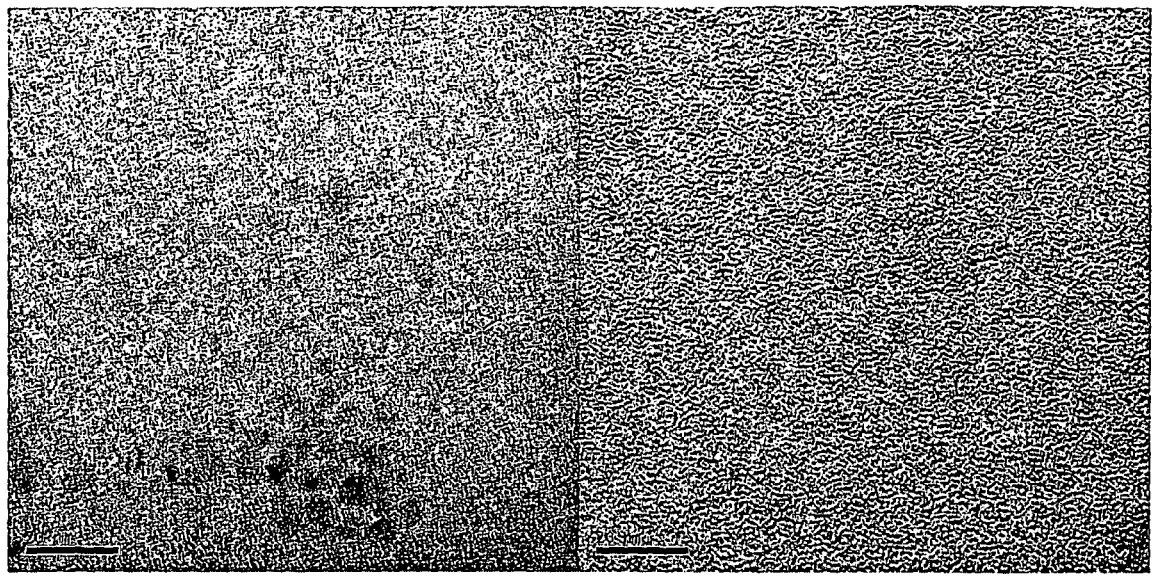
Figure 1: TEM of pyridine-protected Cu$_2$O nanoparticles
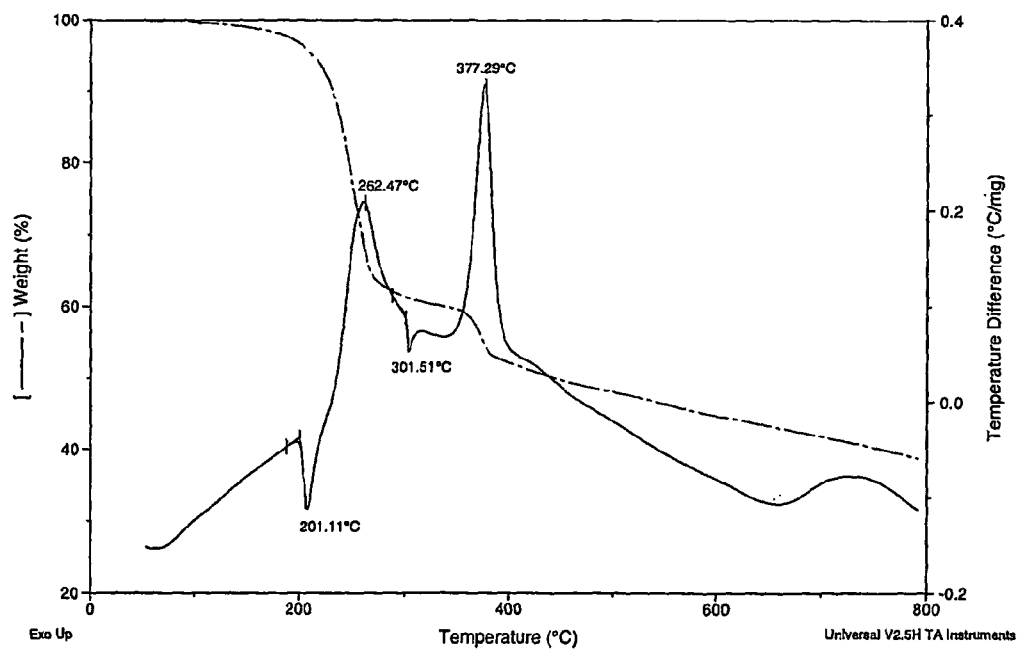
Figure 2: DTA/TGA of Cu$_2$O nanoparticles

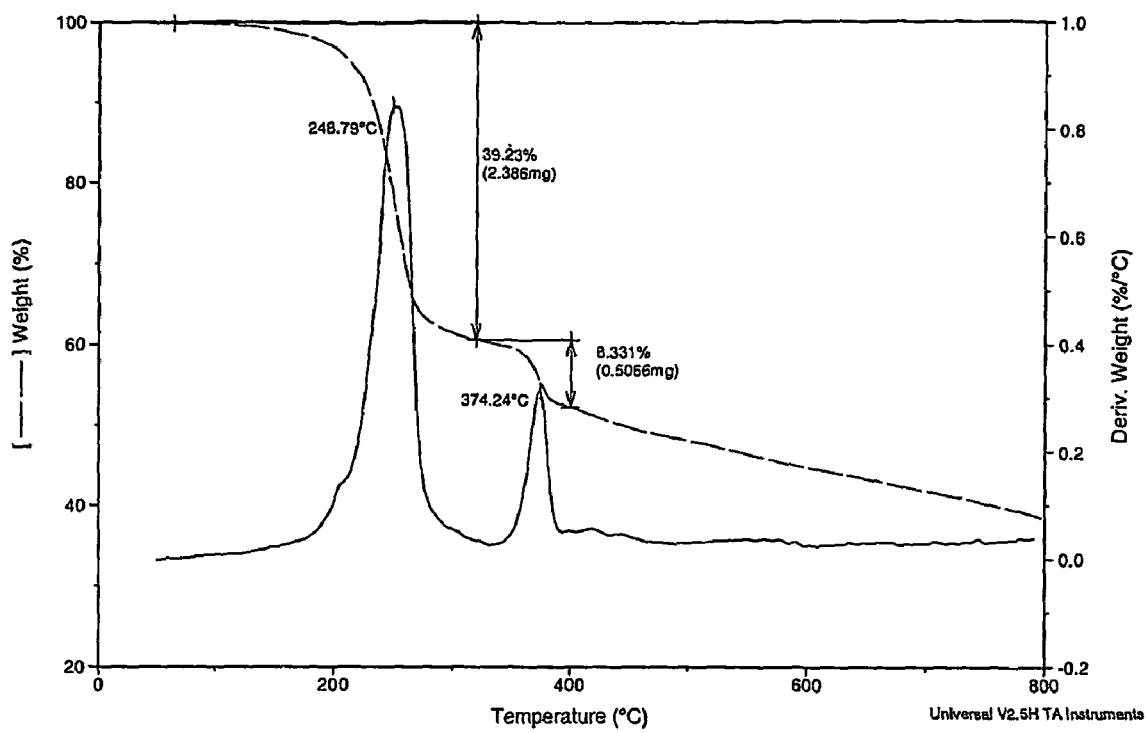
Figure 3: TGA and its derivative curve of $Cu_2O$ nanoparticles
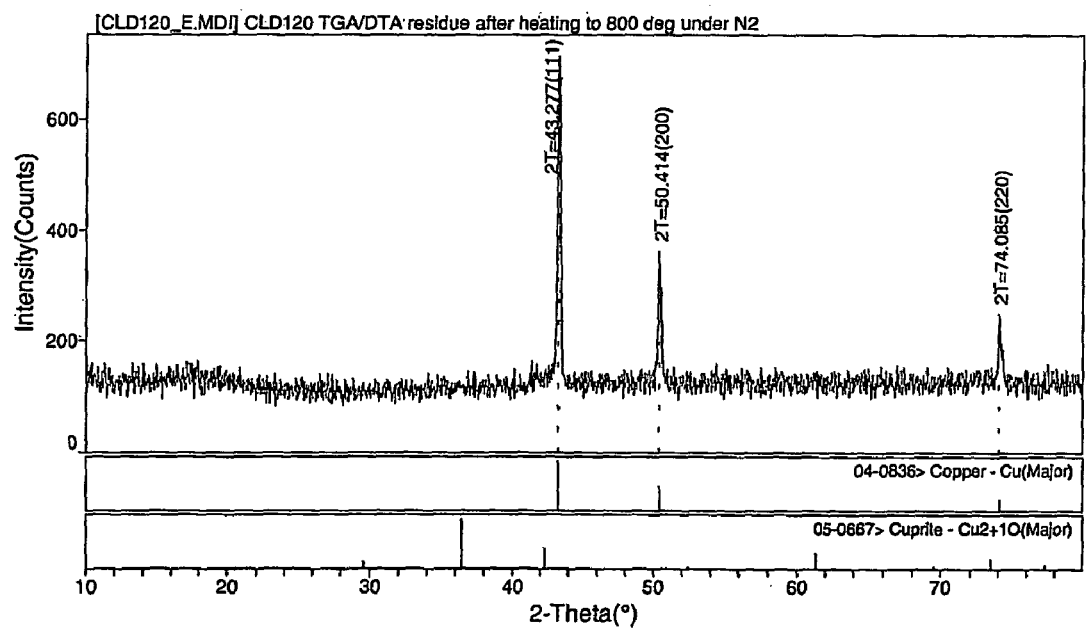
Figure 4: XRD of $Cu_2O$ nanoparticles after heating to 800°C under inert atmosphere

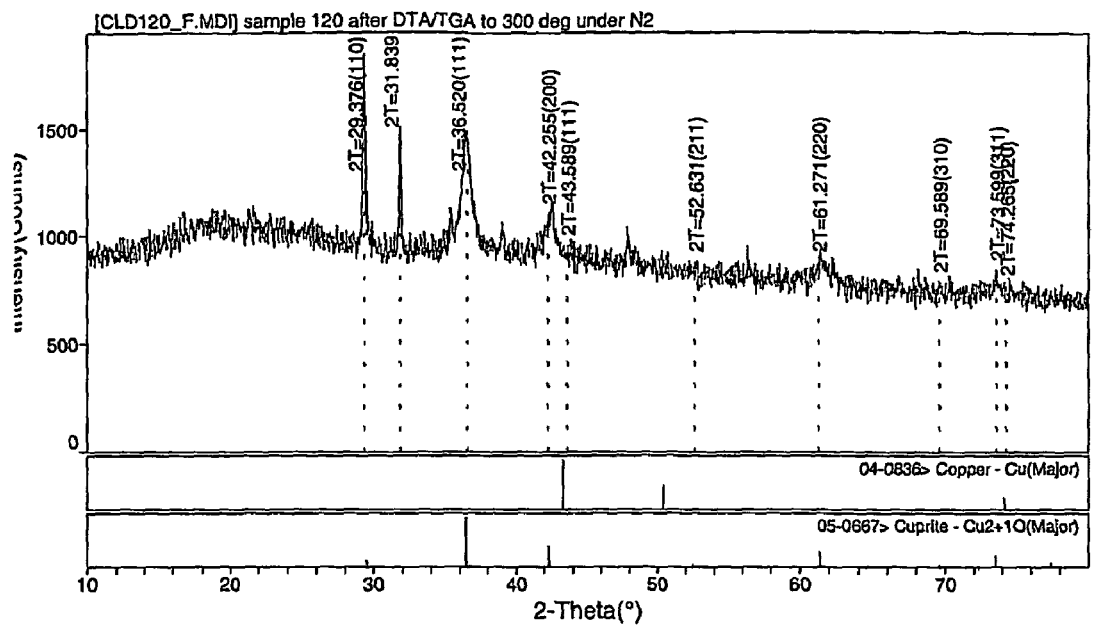
Figure 5: XRD of Cu$_2$O nanoparticles after heating to 300°C under inert atmosphere
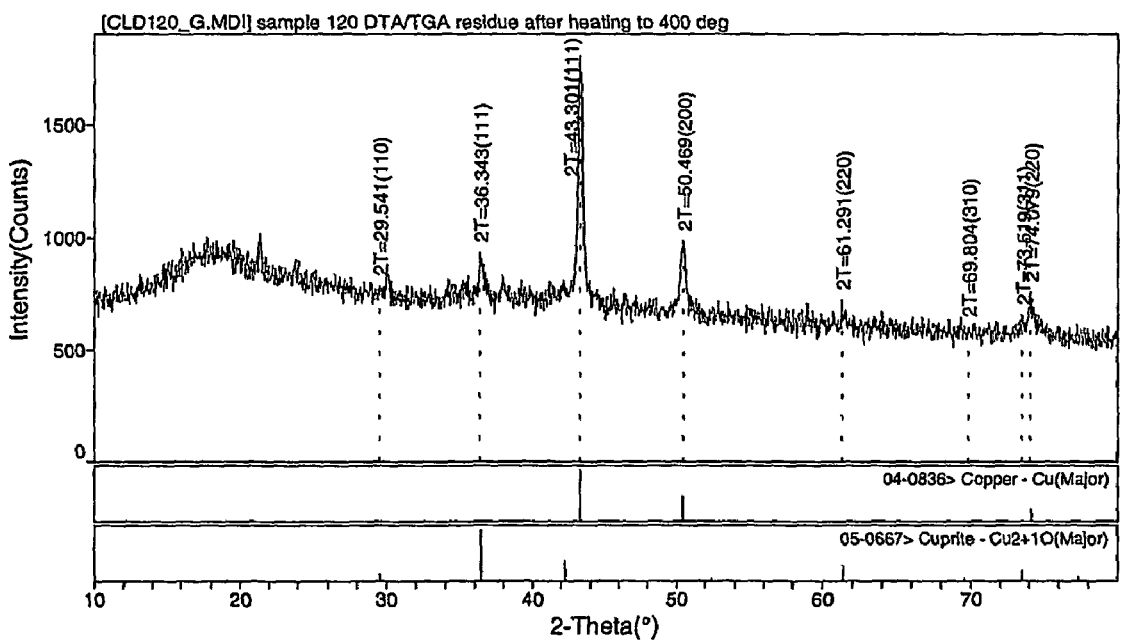
Figure 6: XRD of Cu$_2$O nanoparticles after heating to 400°C under inert atmosphere

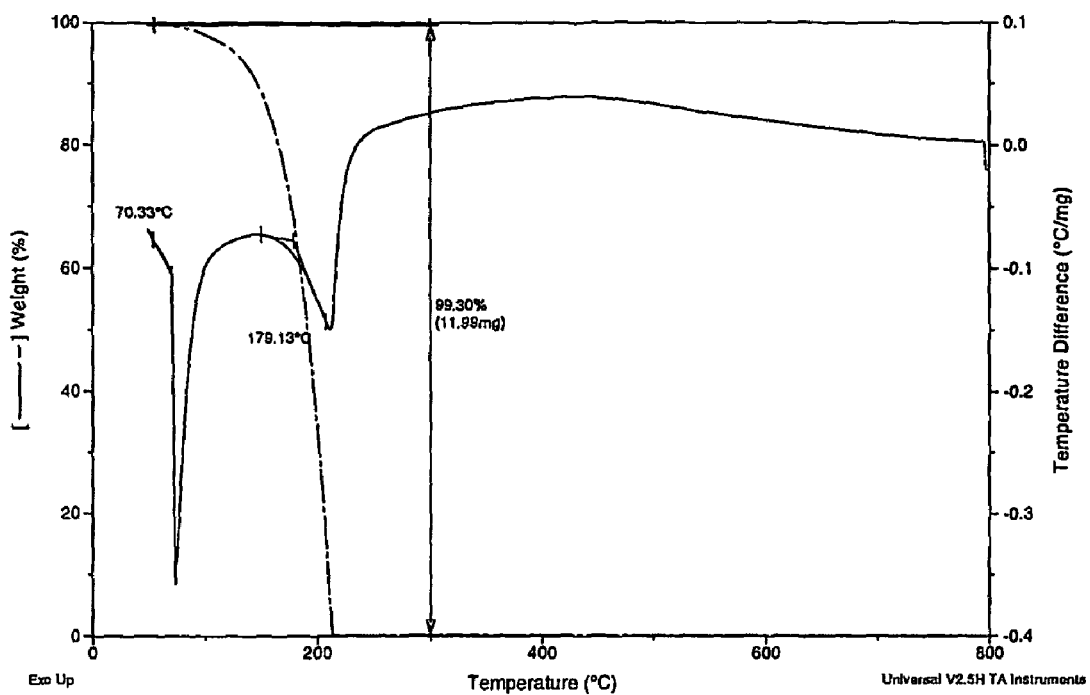
Figure 7: DTA/TGA of unbound 2,2'-bipyridyl
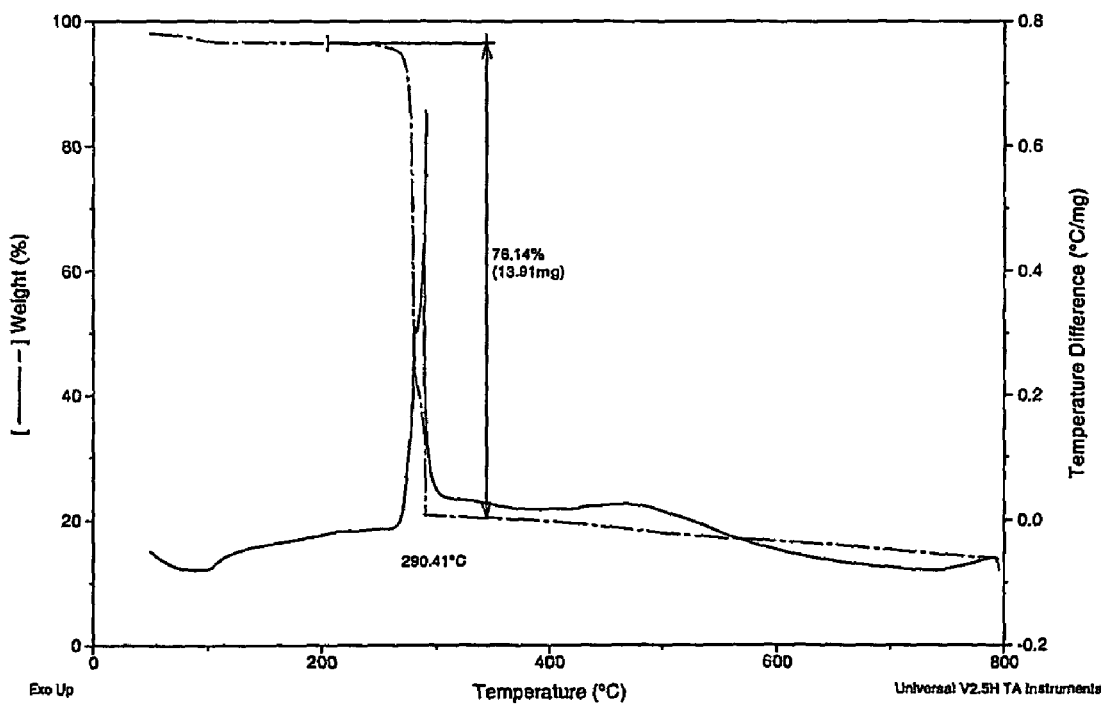
Figure 8: DTA/TGA of copper(II) complex of 2,2'-bipyridyl

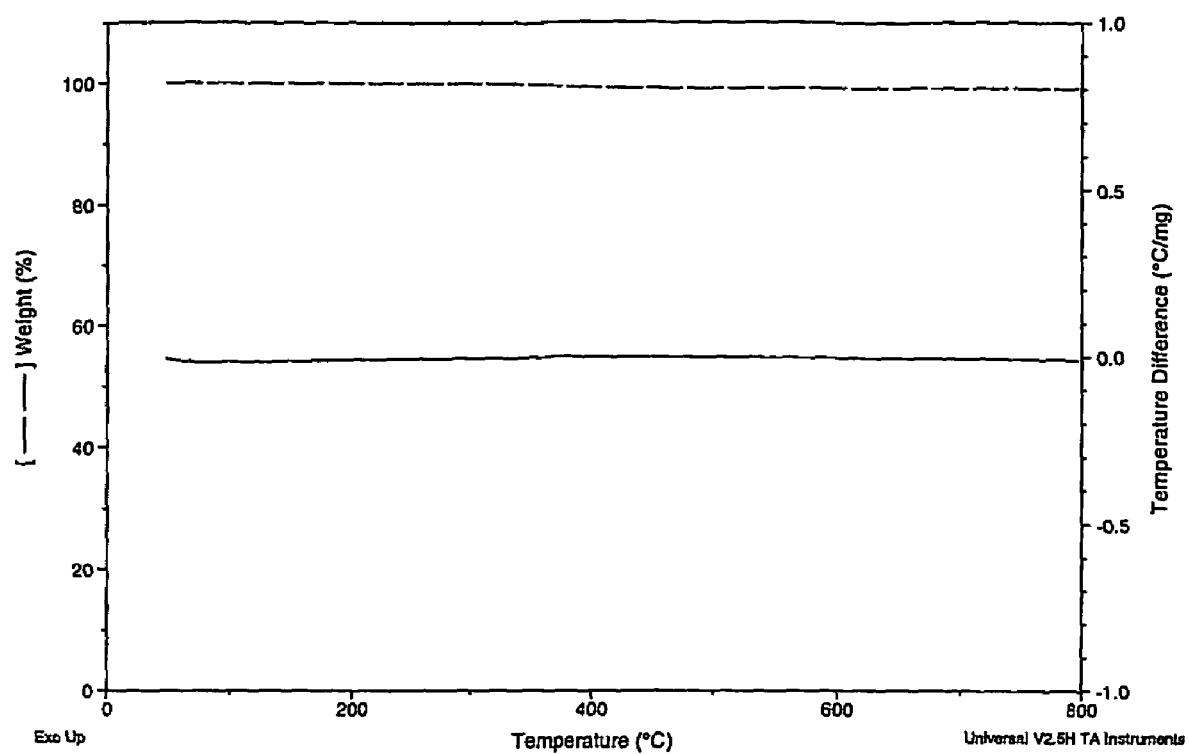
Figure 9: DTA/TGA of bulk $Cu_2O$

METAL OXIDE-CONTAINING NANOPARTICLES

CROSS-REFERENCE TO RELATED APPLICATION

This application claims the benefit of U.S. provisional application Ser. No. 60/456,528 filed Mar. 21, 2003.

BACKGROUND OF THE INVENTION

1. Field of the Invention

The present invention is related to metal oxide-containing nanoparticles and to methods of making said metal oxide-containing nanoparticles; and in particular to copper oxide-containing nanoparticles that are reducible to copper metal by heating or by contacting with a reducing agent.

2. Background Art

Semiconductor technology increasingly requires the fabrication of faster and more densely packed integrated circuits. This increasing demand necessitates better control of conductive interconnects. Of particular interest is the formation of interconnects in trenches with high aspect ratios. It is anticipated that aspect ratios of 1.9 or higher will be required within the next decade. Currently, the most common methods of forming interconnects are by physical vapor deposition, chemical vapor deposition, or electrochemical deposition. Aluminum and copper are the most common metals used for this purpose. In the typical application, trenches and other structures are overfilled with copper. Wafers treated in such a manner are then subjected to chemical mechanical polishing which is somewhat tedious and causes the surface of the interconnect to be curved. Moreover, each of these techniques is somewhat susceptible to defects. More importantly, the vacuum coating technologies such as physical vapor deposition and chemical vapor deposition require significant capital equipment costs and are not able to achieve very high aspect ratios.

Metal nanoparticles have been recognized as potentially useful in forming conductive interconnects in such semiconductor devices. The nanoparticle size range is typically taken to be from about 1 nm to about 100 nm. Particles of such dimensions exhibit unusual properties which may advantageously be applied when forming interconnects. Although such nanoparticles exhibit some collective atomic behavior, surface and quantum effects may be important. The lower melting points of nanosized metal particles make such particles attractive for interconnect technology. Such reduction in melting point can be over 500° C. with melting points of less than 350° C. attainable for many nanosized metals. In the typical application, a dispersed solution containing the nanoparticles is applied to a substrate having trenches by spin coating or some other dispersal technique. The nanoparticles will preferentially aggregate in the trenches. The substrate is then heated to sinter and/or melt the nanoparticles together thereby forming the interconnect.

U.S. patent application No. 20030008145 discloses a method of malting metal nanocrystals that include passivating ligands. The metal nanoparticles of this application have enhanced solubility and/or dispersion because of the passivating ligands associated with the nanocrystals. However, metal containing nanoparticles are somewhat undesirable because of the increased reactivity of such particles and in particular to the potentially violent oxidation reaction that may occur in the presence of oxygen, water, or certain organic compounds.

Accordingly, there exists a need in the prior art for improved methods of making metal interconnects and for precursors for making such interconnects that are both economical and stable.

SUMMARY OF THE INVENTION

The present invention overcomes the problems of the prior art by providing a metal oxide-containing composition that includes nanoparticles described on average by Formula I:

$$M_xO_y \qquad \text{I; and}$$

one or more heteroatom donor ligands bonded to the surface of the nanoparticles, where M is a metal; O is oxygen; and x and y are numbers having a ratio that is equal to the ratio of the average number of M atoms to the average number of O atoms in the nanoparticles. Typically, x and y will be reduced to simpler ratios by methods known to those skilled in the art. The nanoparticles are stabilized by the one or more heteroatom donor ligands which act as a protective layer that cap the surface of the nanoparticles. This allows for long-term stability and allows the nanoparticles to be readily modified to adjust solubility in a wide range of solvents. Moreover, the nanoparticles may be prepared having a variety of metal to oxygen ratios. The metal oxide-containing nanoparticles of the present invention typically have a narrow size distribution having mean sizes in the range of 1 nm to 100 nm in diameter.

In another embodiment of the present invention, a metal oxide nanoparticle-containing solution which takes advantage of the adjustability of the solubility of the metal oxide-containing nanoparticles is provided. The metal oxide-containing solution of the invention comprises the metal oxide composition set forth above and a solvent in which the metal oxide-containing nanoparticles are soluble.

In yet another embodiment of the present invention, a method for making metal oxide-containing nanoparticles is provided. The method of the invention comprises reacting solution of a metal ion solution with a heteroatom donor ligand to form a metal complex. The complex is next reacted with a reducing agent to form the metal oxide-containing nanoparticles. In a refinement of this embodiment, the metal oxide-containing nanoparticles are advantageously reduced to bulk metal upon heating at modest temperatures under an inert atmosphere. The temperature of reduction is believed to vary as a function of nanoparticle diameter. Thermal reduction of bulk copper oxides to copper has not been observed at temperatures less than 800° C. Accordingly, such copper oxide-containing nanoparticles have potential application as precursors to high purity, low resistivity copper films and may serve as a means of filling sub-micron features on silicon wafers.

BRIEF DESCRIPTION OF THE DRAWINGS

FIG. 1 is a transmission electron micrograph ("TEM") of pyridine-protected $Cu_2O$ nanoparticles of the present invention.

FIG. 2 are the plots of simultaneously performed differential thermal analysis and thermogravimetric analysis of the $Cu_2O$ nanoparticles of the present invention.

FIG. 3 is a plot of the thermogravimetric analysis and its derivative curve for the $Cu_2O$ nanoparticles of the present invention.

FIG. 4 is the powder X-ray diffraction ("XRD") of the $Cu_2O$ nanoparticles of the present invention after heating to 800° C. under inert atmosphere.

FIG. 5 is the XRD of the Cu$_2$O nanoparticles of the present invention after heating to 300° C. under inert atmosphere.

FIG. 6 is the XRD of the Cu$_2$O nanoparticles of the present invention after heating to 400° C. under inert atmosphere.

FIG. 7 are the plots of simultaneously performed differential thermal analysis and thermogravimetric analysis of unbound 2,2'-bipyridine.

FIG. 8 are the plots of simultaneously performed differential thermal analysis and thermogravimetric analysis of copper(II) complex of 2,2'-bipyridine.

FIG. 9 are the plots of simultaneously performed differential thermal analysis and thermogravimetric analysis of bulk Cu$_2$O.

DETAILED DESCRIPTION OF THE PREFERRED EMBODIMENT(S)

Reference will now be made in detail to presently preferred compositions or embodiments and methods of the invention, which constitute the best modes of practicing the invention presently known to the inventors.

In an embodiment of the present invention, a metal oxide-containing composition is provided. The composition of the present invention comprises nanoparticles described on average by Formula I:

$$M_xO_y \qquad \text{I; and}$$

one or more heteroatom donor ligands bonded to the surface of the nanoparticles, wherein M is a metal;

O is oxygen; and x and y are numbers having a ratio that is equal to the ratio of the average number of M atoms to the average number of O atoms in the nanoparticles. Preferably, M is a metal selected from beryllium, magnesium, aluminum, scandium, titanium, vanadium, chromium, manganese, iron, cobalt, nickel, copper, zinc, gallium, germanium, yttrium, zirconium, niobium, molybdenum, technetium, ruthenium, rhodium, palladium, silver, cadmium, indium, tin, antimony, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, thallium, lead, bismuth, polonium, thorium, protactinium, uranium, neptunium, and plutonium. More preferably M is a metal selected from Group 9 through Group 11 elements; and most preferably, M is copper with the metal oxide nanoparticles having formula II:

$$Cu_xO_y \qquad \text{II}$$

The average number of metal atoms and oxygen atoms in the nanoparticles is calculated from the range of possible mean diameters of the nanoparticles which is from about 1 nm to about 1000 nm. More preferably, the range of possible mean diameters is from about 1 nm to about 100 nm; and most preferably the mean diameters of the nanoparticles is less than about 20 nm. Preferably, the number of metal atoms M is from about 10 to about $5 \times 10^{10}$. More preferably, the number of metal atoms M is from about 10 to about $5 \times 10^9$; and most preferably the number of metal atoms M is less than about $4.0 \times 10^5$ atoms. The number of O atoms is preferably equal to at least about 0.01 times the number of M atoms. More preferably, the number of O atoms is equal to at least about 0.1 times the number of M atoms; and most preferably, the number of O atoms is equal to at least about 0.3 times the number of M atoms. Similarly, y is preferably equal to at least 0.01x. More preferably y is equal to at least 0.1x; and most preferably, y is equal to at least 0.3x. Typically, x and y will be reduced to simpler ratios by methods know to those skilled in the art. The maximum value for y is about that amount necessary to satisfy the valence of the highest oxidation state of the metal. However, slightly more oxygen may be present because of oxygen-based defects in the nanoparticles. Preferably, y is equal to or less than 5x. More preferably y is equal to or less than about 3x. For example, for a nanoparticle of 200 M atoms and 100 O atoms the formula will be expressed as M$_2$O. The nanoparticles of the present invention may be crystalline (nanocrystals) or may be amorphous. The typical nanoparticles are spherical particles, but other shapes may be suitable. Metal oxide containing nanoparticles of the following morphologies are of potential interest: spherical, ellipsoidal, rod-shaped, polyhedral, as well as others.

The metal atoms of the nanoparticles may be of uniform oxidation state or may be present as mixtures of oxidation states. Different oxidation states of the metal are one or more of the values selected from 0, +1, +2, +3, +4, +5, +6, +7, and +8. In the case of copper, the most likely copper oxidation states are 0, +1, and +2, but others are possible. The typical copper oxide nanoparticle preparation (as given in synthesis description below) results in particles that are uniformly composed of cuprite, Cu$_2$O.

The nanoparticles are protected from oxidation and/or agglomeration by virtue of a protective (or passivating) layer by the one or more heteroatom donor ligands that are chemically bonded to the surfaces of the nanoparticles. The nature of the protective ligand allows for the nanoparticles to be dissolved or finely dispersed in a variety of liquid solvents. The protective ligands can easily be tailored by adding or changing functional groups such that a high degree of solubility is achieved in the solvent of choice. For example, by using 2,2'-bipyridine as the protective ligand copper oxide particles can be prepared that are soluble in methanol, ethanol, 1-propanol, isopropanol, 1-butanol, acetone, dichloromethane, ethylene glycol, as well as other polar solvents. By using 2,2'-bipyridine to which long alkyl chains have attached to the aromatic ring, solubility in non-polar solvents has been achieved. Another example is where the protective ligand is derived from decanoic acid whereby the copper oxide nanoparticles are soluble in non-polar solvents such as hexane. By such a strategy it is envisioned that particles could be made to exhibit solubility in solvents ranging from polar, hydrogen-bonding solvents to non-polar hydrocarbon species and their perfluorinated derivatives, including hexanes and perfluoromethylcyclohexane.

Protecting ligands include all compounds containing an oxygen or nitrogen atom that is capable of acting as an electron-pair donor to form a bond to the nanoparticle surface. Nitrogen donor examples include, but are not limited to, alkyl, amines, pyridine, 2,2'-bipyridine, pyrrole, pyrazole, imidazole, triazole, tetrazole, nitriles, and any substituted variations and salts thereof. Oxygen donor examples include, but are not limited to, carboxylic acids, carbonates, nitrates, nitroalkanes, nitroarenes, hydroxamic acids, ketones, aldehydes, esters, and any substituted variations and salts thereof. Furthermore, it is anticipated that some of the most useful protecting ligands will have some degree of charge stabilization. The nature of ligands having such capability can be described as follows: a) nanoparticle surface is capped by a ligand as described above which bears a charge; the charge may be localized on one or more of the donor-atoms, or localized on one or more of the non-donor atoms, or it may be delocalized through a number of donor and/or non-donor atoms, b) associated with the charge bearing ligands are some number of oppositely charged species which may provide additional stabilization arising from some combination of steric bulk and the formation of a charge barrier. In addition to the one or more heteroatom donor ligands, the metal oxide-containing composition of the present invention may further include one or more loosely bound heteroatom ligands. As used herein, loosely bound means that the heteroatom ligands are associated with the nanoparticles, but are not bonded to the nanoparticles as the one or more heteroatom donor ligands. Such an association may be by electrostatic interaction. Examples of such ligands include, for example, a hetereoatom donor ligand (in this instance the heteroatom donor ligand is not as strongly bonded to the surface of the nanoparticles as described above), nitrate, halide, phosphate, perchlorate, formate, acetate, borate, hydroxide, silicate, carbonate, sulfite, sulfate, nitrite, phosphite, water, or mixtures thereof.

The thermal behavior of the metal oxide nanoparticles is of central interest to the present invention, particularly the observed reduction of the metal oxide-containing nanoparticles to bulk metal upon mild heating. The individual thermal events for a typical sample of metal oxide nanoparticles are as follows: loss of unbound and/or loosely bound ligand, loss of bound ligand, and reduction of metal oxide nanocrystals to bulk metal. The loss of unbound and loosely bound ligand is expected to occur at temperatures at or near the boiling point or sublimation temperature of the ligand molecule. This would generally occur over a narrow temperature range, somewhere between 50° C. and 250° C., depending on the ligand and metal. The loss of bound ligand will generally occur at a temperature significantly higher than that of the unbound ligand; a certain amount of additional energy is required to break bonds to the surface of the nanoparticle. Loss of bound ligand would generally occur at between 100° C. and 300° C. and may be accompanied by ligand decomposition. Reduction of copper oxide-containing nanoparticles to copper generally occurs between 300° C. and 500° C., with lower reduction temperatures being preferred. The typical preparation (as given below) results in $Cu_2O$ nanoparticles having diameters estimated near 4 nm that reduce to bulk copper at around 380° C. Bulk phase $Cu_2O$ is not reduced upon heating, even with temperatures as high as 800° C. The observed low-temperature thermal reduction represents a potentially novel, nano-phase phenomenon that is not known for the bulk-phase of this material. This property, being a result of the size regime of the material, is strongly believed to behave as a function of particle size; the reduction temperature should vary with nanoparticle diameter as a consequence.

In another embodiment of the present invention, a metal oxide-containing solution which takes advantage of the adjustability of the solubility of the metal oxide-containing nanoparticles is provided. The metal oxide-containing solution of the invention comprises the metal oxide composition set forth above and a solvent in which the metal oxide-containing nanoparticles are soluble. As set forth above, the solubility of the metal oxide-containing nanoparticles is adjustable by appropriate selection of the one or more heteroatom donor ligands. This metal oxide-containing solution is particularly useful in applying the nanoparticles to a substrate. Specifically, a substrate is contacted with a nanoparticle-containing solution and then the solvent is evaporated or allowed to evaporate leaving behind the nanoparticles. The metal oxide nanoparticles are then optionally converted to zero-valent metal by heating. In the case of copper oxide-containing nanoparticles with a mean diameter of about 4 nm, this conversion occurs at a temperature of at least 100° C. Alternatively, the conversion to zero-valent metal is accomplished by contacting the metal oxide-containing nanoparticles with a reducing agent. Suitable reducing agent, include but are not limited to, molecular hydrogen, alcohols, amines, or mixtures thereof.

In yet another embodiment of the present invention, a method for making metal oxide-containing nanoparticles is provided. The method of the invention comprises reacting a metal ion in solution (i.e., from a salt) with a heteroatom donor ligand to form a metal complex. Preferably the mole ratio of metal ion to ligand is from about 0.05 to about 20. More preferably, the mole ratio of metal ion to ligand is from about 2 to 6. The metal complex is next reacted with a reducing agent to form the metal oxide-containing nanoparticles. For example, to make copper oxide-containing nanoparticles, $CuX_2$ is reacted with a heteroatom donor ligand to form a copper complex. Preferably the mole ratio of $CuX_2$ to ligand is from about 0.05 to about 20. More preferably, the mole ratio of $CuX_2$ to ligand is from about 0.5 to 10; most preferably the mole ratio of $CuX_2$ to ligand is from about 2 to 6. The copper complex is next reacted with a reducing agent to form the copper oxide-containing nanoparticles. Suitable reducing agents include, but are not limited to, sodium borohydride, lithium aluminum hydride, molecular hydrogen, sodium metal, zinc metal, magnesium metal, aluminum metal, hydrazine, and the like. X is a metal ion counterion. Suitable examples for X include, but are not limited to, halide, nitrate, phosphate, perchlorate, formate, acetate, borate, hydroxide, silicate, carbonate, sulfite, sulfate, nitrite, phosphite, hydrates thereof; and mixtures thereof. The properties of the metal oxide-containing nanoparticles, preferred and suitable metals M, and suitable heteroatom donor ligands are the same as those set forth above for the metal oxide-containing composition set forth above.

The method of the present invention also optionally includes the step of reacting the metal oxide-containing nanoparticles at a sufficiently high temperature to form metal. In the case of copper oxide-containing nanoparticles, the copper oxide-containing nanoparticles are heated to a temperature of at least 100° C. Alternatively, the conversion to metal is accomplished by contacting the metal oxide nanoparticles with a second reducing agent. Suitable second reducing agents, include but are not limited to, molecular hydrogen, alcohols, amines, or mixtures thereof.

The following examples illustrate the various embodiments of the present invention. Those skilled in the art will recognize many variations that are within the spirit of the present invention and scope of the claims.

Synthesis of Copper Oxide Nanoparticles

Described herein is a typical synthesis of copper oxide nanoparticles as described by Scheme I. The particles obtained consist of $Cu_2O$, estimated to be about 4 nm in size, having a 2,2'-bipyridine ("bipy") protective ligand coat. The synthesis is readily scalable, typically giving high yields (>80%, >2 g) of a free-flowing reddish-brown powder. The product is soluble in polar organic solvents such as methanol, ethanol, acetone, and dichloromethane, as well as others. The solid form of the sample can be readily achieved from solutions by removal of solvent under reduced pressure. As a solid, the sample is stable indefinitely if stored at room temperature under argon. The solution is stable for at least one month in an oxygen and moisture free environment. Upon long-term exposure to air, the solid sample retains its properties for at least one week. The sample in solution typically begins to show signs of decomposition after few hours of exposure to air.

1. Synthetic Example

Aqueous copper(II) nitrate (0.167 M, 150 mL) was treated with 2,2'-bipyridine (3.905 g, 0.025 mol) under rapid stirring. Aqueous sodium borohydride (5.0 mM, 80 mL) was added dropwise to the rapidly stirring solution, which had been cooled to 0° C. Upon reduction the reaction mixture became dark reddish-brown in color. As a brown precipitate began to form, the vigorous effervescence of the reaction mixture led to foaming. Stirring was continued, making occasional adjustments so as to accommodate foaming. Upon cessation of foaming and effervescence a dark brown solid was isolated by vacuum filtration. The soluble material was then extracted by treating the solid with several portions of absolute ethanol until the filtrate was colorless. The filtrate was taken to dryness and washed with 20 mL of tetrahydrofuran ("THF") to remove excess ligand. Using standard Schlenk techniques under inert atmosphere, soluble nanoparticles were extracted from the residue using three 40 mL portions of $CH_2Cl_2$. The solution was taken to dryness under vacuum to afford a rust-colored powder that could be readily redissolved in polar organic solvents.

2. Characterization of Copper Oxide-Containing Nanoparticles

A number of methods of characterization have been used to study the copper oxide-containing nanoparticles. Proton Nuclear Magnetic Resonance (1H NMR) of the sample revealed signals that are consistent with the protons of the protecting ligand (in the above case 2,2'-bipyridine). Infrared absorption spectroscopy (IR) for the sample is also consistent with the presence of the protecting ligand (in the above case 2,2'-bipyridine), but also shows peaks that suggest the presence of nitrate, which may be present also as a bound ligand. Powder X-ray diffraction (XRD) data for the sample is inconclusive and may indicate that the particles are amorphous or are very small nanoparticles.

Transmission electron microscopy images have been collected for a copper oxide-containing nanoparticle sample where the ligand is 2,2'-bipyridine and for the analogous pyridine-capped nanoparticle sample. The micrographs from the 2,2'-bipyridine protected sample were consistent with particles of a size on the order of 4 nm. The micrographs of the pyridine-capped copper oxide-containing particles convincingly display relatively monodisperse particles of a mean size near 5.5 nm (FIG. 1). The transmission electron micrograph for these nanoparticles prepared displays both spherical and near-spherical particles having a mean diameter of 5.46 nm. The standard deviation in particle diameter is 1.18 nm (~20% the mean diameter), indicative of a reasonably narrow distribution of size. A number of the particles exhibit distinct lattice fringes, as would be expected for nanocrystals. For other particles the lattice fringes are indistinct or absent. Particles lacking lattice fringes may either be amorphous, lacking a well-defined lattice, or may be crystalline, but positioned in such a way that the lattice is not readily observed. The transmission electron micrograph for cuprite nanoparticles prepared with 2,2'-bipyridine as the capping ligand also displays spherical and near-spherical particles. The mean diameter of the particles is 3.82 nm, with a standard deviation of 0.81 nm. Again, the particles exhibit a reasonably narrow size distribution, with the standard deviation being ~20% of the mean diameter. Lattice fringes are observed for a number of the particles.

Differential thermal analysis (DTA) and thermogravimetric analysis (TGA) were performed simultaneously on a solid sample of 2,2'-bipyridine protected copper oxide-containing nanoparticles (FIGS. 2 and 3). Four regions of interest were found in the DTA of the sample: an endotherm at 201° C., an exotherm at 262° C., an endotherm at 301° C., and an exotherm at 377° C. The TGA exhibited two major regions of weight loss: a loss of 39% of the sample weight centered at 249° C., and a loss of 8% centered at 374° C. The DTA/TGA residue after heating to 800° C. in an inert atmosphere was determined to be bulk copper by XRD (FIG. 4). Heating the sample to 300° C. under DTA/TGA conditions yielded material that was identified by XRD as being predominantly $Cu_2O$, where the crystalline domain was small (<10 nm) as determined by line broadening (FIG. 5). Upon heating to 400° C., the residue was observed to become bulk phase copper as determined by XRD (FIG. 6).

To understand better the implications of the DTA/TGA data, DTA/TGA was performed on a series of reference materials. The endothern at 201° C. correspond well to that observed for the volatilization point of unbound 2,2'-bipyridine (FIG. 7). The fact that this endotherm is not accompanied by a weight loss for the nanoparticle sample indicates that the amount of unbound (or loosely bound) 2,2'-bipyridine in the sample is small. The exotherm at 262° C. and the weight loss centered at 249° C. appear to concur with the loss of bound 2,2'-bipyridine as determined by comparison to the DTA/TGA of the copper(II) complex of 2,2'-bipyridine (FIG. 8). The exotherm at 377° C. and the concurrent weight loss at 374° C. are clearly due to the loss of oxygen from $Cu_2O$ to give copper as stated above. DTA/TGA was performed on a sample of bulk $Cu_2O$ (FIG. 9); no thermal features were observed. The residue was found to be bulk $Cu_2O$ after heating to 800° C. under inert atmosphere.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A metal oxide-containing composition, the composition comprising:

metal oxide nanoparticles having a surface, the metal oxide nanoparticles described on average by Formula I:

$$M_xO_y \qquad \text{I; and}$$

one or more heteroatom donor ligands bonded to the surface of the nanoparticles, the donor ligands selected from the group consisting of pyrazole, imidazole, triazole, tetrazole, and combinations thereof, wherein M is a metal consisting of one or more of the following oxidation states: +1, +2, +3, +4, +5, +6, +7, and +8;

O is oxygen; and x and y are numbers having a ratio that is equal to the ratio of an average number of M atoms to an average number of O atoms in the nanoparticles, wherein the average number of M atoms is from about 10 to about $5 \times 10^{10}$ atoms and the average number of O atoms is at least about 0.01 times the number of M atoms.

2. The metal oxide-containing composition of claim 1 wherein M is a metal selected from the group consisting of beryllium, magnesium, aluminum, scandium, titanium, vanadium, chromium, manganese, iron, cobalt, nickel, copper, zinc, gallium, germanium, yttrium, zirconium, niobium, molybdenum, technetium, ruthenium, rhodium, palladium, silver, cadmium, indium, tin, antimony, lanthanum, cerium, praseodymium, neodymium, promethium, samarium, europium, gadolimium, terbium, dysprosium, holmium, erbium, thulium, ytterbium, lutetium, hafnium, tantalum, tungsten, rhenium, osmium, iridium, platinum, gold, thallium, lead, bismuth, polonium, thorium, protactinium, uranium, neptunium, and plutonium.

3. The metal oxide-containing composition of claim 1 wherein M is a metal selected from the group consisting of Group 9 through Group 11 elements.

4. The metal oxide-containing composition of claim 1 wherein the nanoparticles have a mean diameter from about 1 nm to 100 nm.

5. The metal oxide-containing composition of claim 1 wherein the nanoparticles have a mean diameter less than about 20 nm.

6. The metal oxide-containing composition of claim 1 wherein the nanoparticles have a spherical, ellipsoidal, rod-shaped, or polyhedral morphology.

7. The metal oxide-containing composition of claim 1 wherein the metal oxide nanoparticles include amorphous or crystalline domains.

8. The metal oxide-containing composition of claim 1 wherein the nanoparticles include a mixture of metal atoms in different oxidation states.

9. The metal oxide-containing composition of claim 1 further comprising one or more loosely bound heteroatom ligands.

10. The metal oxide-containing composition of claim 9 wherein the one or more loosely bound heteroatom ligands are selected from the group consisting of nitrate, halide, phosphate, perchlorate, formate, acetate, borate, hydroxide, silicate, carbonate, sulfite, sulfate, nitrite, phosphite, water, alkyl amines, pyridine, 2,2'-bipyridine, pyrrole, pyrazole, imidazole, triazole, tetrazole, nitriles, carboxylic acids, carbonates, nitrates, nitroalkanes, nitroarenes, hydroxamic acids, ketones, aldehydes, esters or mixtures thereof.

11. A copper oxide-containing composition, the composition comprising:

copper oxide nanoparticles having a surface, the metal oxide nanoparticles described on average by Formula II:

$$Cu_xO_y$$ II; and one or more heteroatom donor ligands bonded to the surface of the nanoparticles, the donor ligands selected from the group consisting of pyrazole, imidazole, triazole, tetrazole, and combinations thereof, wherein Cu is copper;

O is oxygen; and x and y are numbers having a ratio that is equal to the ratio of an average number of Cu atoms to an average number of O atoms in the nanoparticles, wherein the average number of Cu atoms is from about 10 to about $5 \times 10^{10}$ atoms and the average number of O atoms is at least about 0.01 times the number of Cu atoms.

* * * * *